United States Patent
Tseng et al.

(10) Patent No.: US 8,124,938 B1
(45) Date of Patent: Feb. 28, 2012

(54) LINEAR X-RAY DETECTOR WITH MONOLITHIC DETECTOR CHIP INCLUDING BOTH PHOTODIODE ARRAY AND PERIPHERAL CIRCUITS SPACED APART

(75) Inventors: Hsin-Fu Tseng, San Jose, CA (US); Lin-Bo Yang, San Jose, CA (US); Shizu Li, San Jose, CA (US)

(73) Assignee: X-Scan Imaging Corporation, San Jose, CA (US)

( * ) Notice: Subject to any disclaimer, the term of this patent is extended or adjusted under 35 U.S.C. 154(b) by 815 days.

(21) Appl. No.: 12/228,809

(22) Filed: Aug. 18, 2008

(51) Int. Cl.
*H01L 27/146* (2006.01)
*H01L 27/00* (2006.01)

(52) U.S. Cl. .................. 250/370.09; 250/208.1

(58) Field of Classification Search ............. 250/370.09, 250/370.11, 366, 367, 208.1; 378/4, 19; 257/432, E31.097
See application file for complete search history.

(56) References Cited

U.S. PATENT DOCUMENTS

| | | | | |
|---|---|---|---|---|
| 5,464,984 A | * | 11/1995 | Cox et al. | 250/370.11 |
| 6,510,195 B1 | * | 1/2003 | Chappo et al. | 378/19 |
| 2008/0001091 A1 | * | 1/2008 | Kobayashi et al. | 250/366 |

* cited by examiner

*Primary Examiner* — David Porta
*Assistant Examiner* — Faye Boosalis
(74) *Attorney, Agent, or Firm* — Carr & Ferrell LLP

(57) ABSTRACT

A radiation damage resistant linear X-ray detector array system based on a unique buttable monolithic image sensor design and precision chip-on-board assembly technology includes at least one of the detector chips. Multiple chips of the image sensor may be butted end-to-end on a common printed circuit board to accommodate larger detection systems. A layer of scintillating material, such as $Gd_2O_2S$:Tb (GOS), CsI(Tl), or $CdWO_4$, is placed on the image sensor to convert the impinging X-ray energies into visible light which can be detected efficiently by the image sensor array. A protective metal shield is fastened to the substrate to protect the sensitive circuits of the image sensor from X-ray radiation damage. A proper separation of sensitive circuits from the photodiode array on the sensor chip, coupled with precision registration of the sensor chips on the substrate, allows easy installation of the protective metal shield.

15 Claims, 10 Drawing Sheets

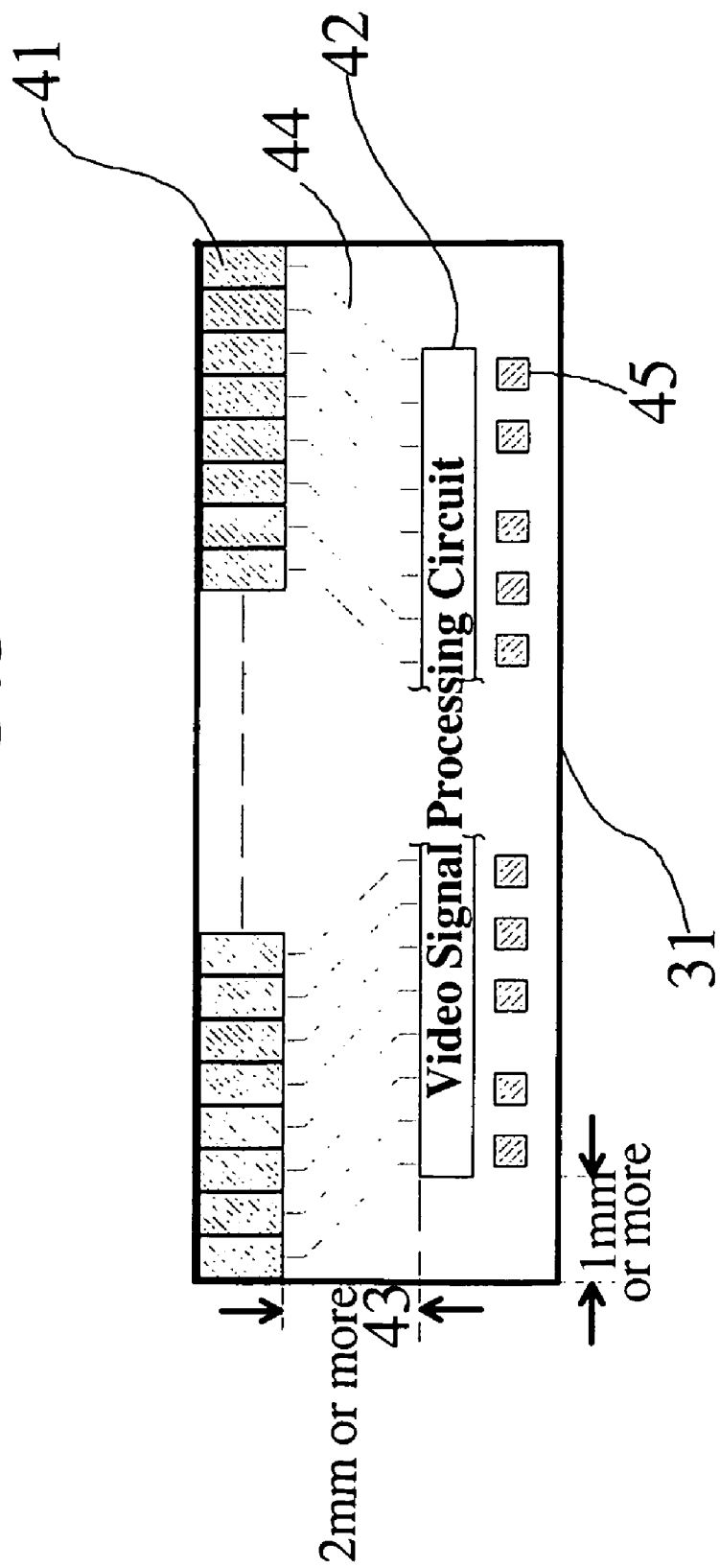

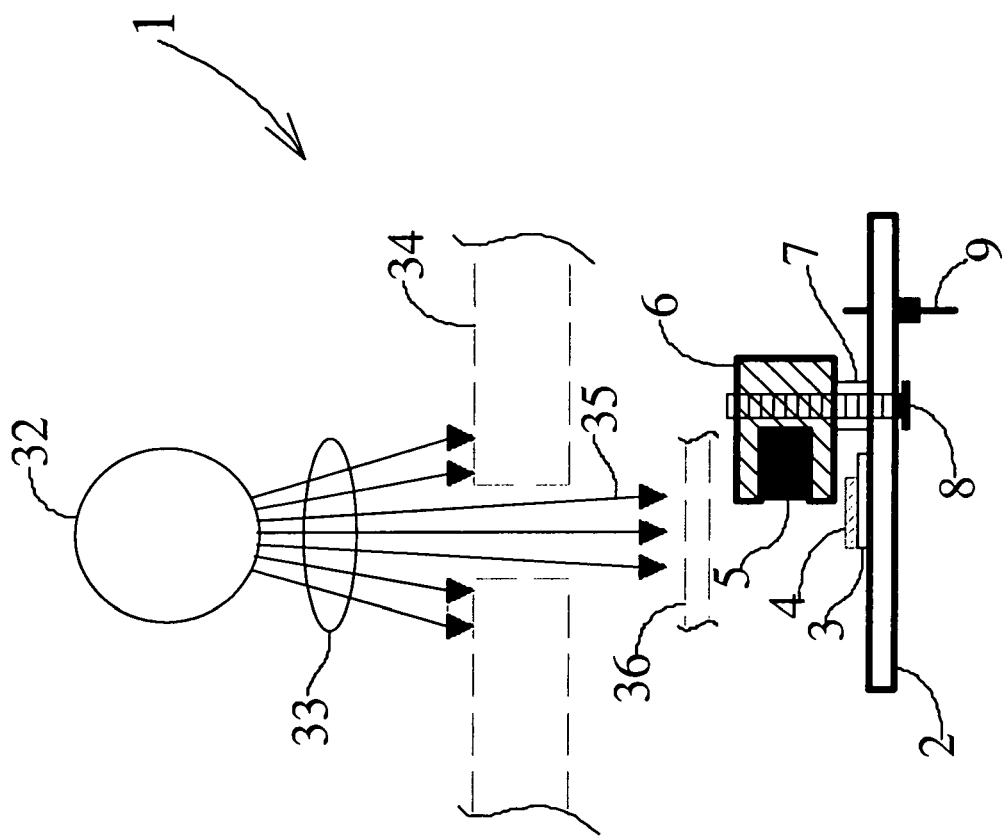

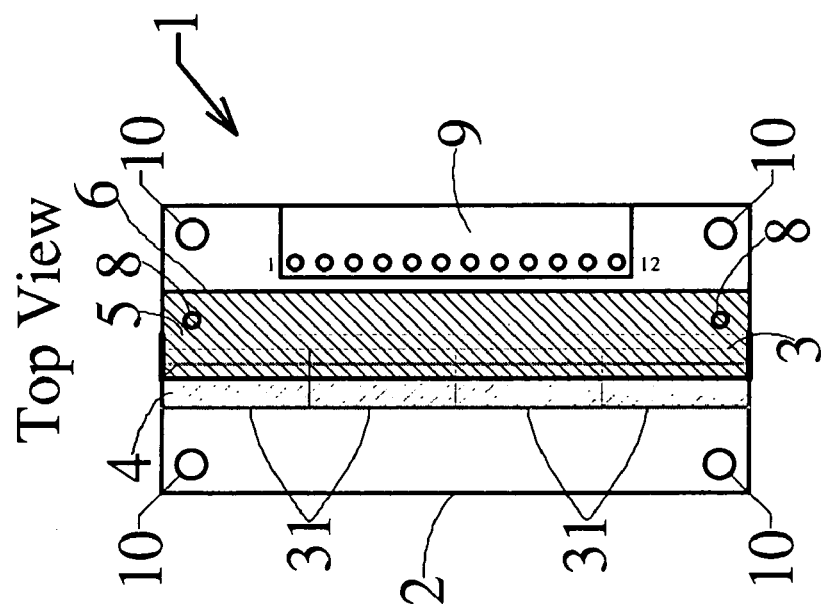
FIG. 7B Top View

LINEAR X-RAY DETECTOR WITH MONOLITHIC DETECTOR CHIP INCLUDING BOTH PHOTODIODE ARRAY AND PERIPHERAL CIRCUITS SPACED APART

BACKGROUND OF THE INVENTION

1. Field of the Invention

The present invention pertains generally to the field of solid-state X-ray imaging systems and displays, and more particularly is an X-ray system utilizing a buttable monolithic photodiode detector array. The monolithic photodiode detector array includes both the photodiode array circuits and the peripheral circuits spaced apart from the photodiode array circuits to allow precision shielding of the peripheral circuits from x-ray radiation damage.

2. Description of the Prior Art

As used in this disclosure, X-rays are defined as ionizing electromagnetic radiation that is damaging to semiconductor-based image sensor arrays. X-rays also include the radiation known as "extreme ultraviolet radiation" and "gamma rays". Since few X-rays with energies exceeding 10 keV can be captured by commonly used semiconductor-based image sensor arrays (arrays using Si, Ge, etc.), the X-ray energies must be converted into a detectable form. The current art image sensor arrays are processed on silicon and are only sensitive to light with wavelengths at or near the visible spectrum. Therefore, the sensor arrays require an X-ray-to-visible-light converter in order to detect the X-rays. To this end, X-ray sensitive scintillating materials, such as $Gd_2O_2S$: Tb (GOS), CsI(Tl), or $CdWO_4$ have been used. These materials greatly enhance the detection efficiency of higher energy X-rays in silicon based sensor arrays through the ability of the scintillating materials to convert and emit visible light photons proportional to the X-ray energy and dose.

The visible light photons are converted to electrical signals by a silicon based image sensor array, such as a Linear Photodiode Array (PDA). When the image sensor array is read out, the array sequentially produces a stream of electrical video signals from each photo-element with amplitudes proportional to the intensity of the X-ray pattern that impinges on the photo-elements.

However, a problem arises in that the scintillation layer on top of the silicon photo-elements will not absorb the X-ray photons completely. Some portion of the X-ray particles penetrates the scintillation layer and is captured by the image sensor array structure, causing irreversible radiation damage to the image sensor array. Therefore, if the image sensor array used in the X-ray imaging system lies in the X-ray path and is not isolated or protected from X-ray exposure, radiation damage will be inflicted on the silicon image sensor array. As a result, the silicon arrays used in current art X-ray imaging systems have a limited useful life time.

FIG. 1 is a simplified electrical block diagram describing the signal processing required for an X-ray detector system. Since the present invention involves only the optical and mechanical structures of such systems, the generalized electrical block diagram shown in FIG. 1 is demonstrative of the signal processing circuitry used in all the systems described herein.

In FIG. 1, the detector is a monolithic CMOS image sensor array (PDA) with pixel signal processing and sample/hold circuits, global video signal processing circuits, and the read-out control circuits for the array. As is known in the art, the PDA is an array of n-p (or p-n) junction photodiodes. Each photodiode has an on-chip signal integration, signal conditioning circuit to accumulate the light signal and to remove dark fixed-pattern noise. Each photodiode also has a sample and hold circuit to hold the video signal for read out while the photodiode is integrating the next line of signal. The detector has a digital scanning shift register to read out the video signal at each photodiode in sequence. There are also global signal processing circuits to process and amplify the video signal before it is output to outside the detector chip. All the control clocks for the scanning operation and signal processing are generated by an on-chip time base generator.

As shown in FIG. 1, when the photodiodes are exposed to light, each diode collects the photons in the immediate area and converts them to signal charges. The signal charges are collected and stored in the integrating circuit. During a single line-scan time, which is known as the integration time, each photodiode goes through an integration process. At the end of each integrating process, the accumulated signal of each photodiode is then sampled and held for signal readout. The photodiode array then begins the signal integration process for the next line while the sampled and held signals are being read out sequentially by the scanning shift register.

The scanning process is initiated by a start pulse, SP. Since the integration time is equal to the line-scan time, the line rate of the video signal is determined by the time required to generate the start pulse, which initiates the scanning of the shift register, SR. As the SR shifts a pulse through its register, a row of MOS switches, SW, that are in series with the photodiode are accessed in sequence. The pulse from the SR closes the switch and allows the video signal of each pixel to be output through the global signal processing chain.

To form a Direct Coupled X-ray Detector, a uniform layer of the scintillating material, SCIN, is deposited directly on the sensing areas of the PDA, or a uniform layer of the scintillating material is placed directly on top of the sensing areas of the PDA. The shaded area with diagonal lines in FIG. 1 shows a SCIN layer that has been deposited over the active PDA. SCIN is a uniform coated layer that emits visible photons when its atoms are excited by the impinging beams of the X-ray. The light energies, proportional to the intensity of the X-ray beams, directly expose the active sensing areas of the image sensor and are processed as described above.

FIGS. 2a-b show the optical and mechanical components of one of the current art X-ray detector systems commonly used today, a Direct Coupled Detector System. This system is the least complicated in terms of fabrication and applications, and therefore results in lower cost than other systems. The details of the drawing are limited to components relevant to the present invention.

FIG. 2a shows an isometric view of the components: the image sensor (IS) mounted on a dual-in-line package (DIP), the test specimen (TS), the exposing X-ray beam (XPXB), etc. FIG. 2b is a sectional view. In FIGS. 2a-b the image sensor array (IS), the test specimen under X-ray imaging (TS), the exposing X-ray beam (XPXB), and the scintillation coating (SCIN) on the sensor die are depicted to show the geometrical relationship among the components involved in X-ray testing of the test specimen, TS.

In operation the X-ray source emanates the exposing X-ray beam and exposes the test specimen. The X-ray flux patterns are modulated by the specimen under test as the flux pattern passes onto the surface of the scintillation coating. Since the scintillation coating is coated directly onto the surface of the image sensor, the converted light energies proportional to the X-ray flux patterns are integrated by the image sensor array as the sensor array generates the image video signals.

The Direct Coupled Detector System illustrated in FIG. 2 shows that the exposing X-ray beam passes through the test specimen, the scintillating layer, and the image sensor array. Accordingly, the image sensor array receives that portion of the X-ray flux which is not absorbed by the scintillation layer, causing radiation damage on the silicon sensor. In many applications this radiation exposure is intolerable because it drastically reduces the lifetime of the image sensor array, thereby requiring continual replacement and maintenance of the X-ray imaging system.

Although the impingement of the residual X-ray flux directly on the image sensor is intolerable for many applications, the primary advantages of the method arise from its simplicity in structure and the close proximity of the scintillating layer to the image sensor array, which improves imaging resolution. Among the advantages of this system are that the detectors are simple to fabricate, i.e., the detectors can be fabricated by simply applying a SCIN coating process to existing image sensors, such as the PDA. This is a great advantage in applications where a shorter lifetime X-ray detector system is required, for example, in destructive testing where the measuring equipment is also destroyed.

Another advantage of a direct coupled detector system arises from the close proximity of the scintillation layer and the photo-element. Since the scintillating coating is in contact with the image plane of the image sensor array, there is little or essentially no space between them. This close proximity gives the detector the ability to retain its optimum resolution and Modulation Transfer Function (MTF).

Another advantage of the system, arising from the close proximity of the PDA and the scintillating layer, is the light coupling efficiency, i.e., there is very little light energy loss in the transmission between the PDA and the scintillating layer. Another advantage, which arises from its simple structure, is that the system can be implemented in a small enclosure. The ability to use the system in a small enclosure also allows the system to be designed as a portable unit.

However, there are also several drawbacks to the Direct Coupled Detector System. The system user must tolerate a shorter lifetime for the X-ray detector system in a given application, and the PDA must be continually replaced. The Direct Coupled Detector System has a high maintenance cost, requires intensive labor, and requires a significant amount of down time.

In addition to the high operating cost of the system, a major disadvantage stems from the properties of semiconductors in general. Not only are image sensors subject to radiation damages, but all semiconductors, to various degrees, are susceptible to damage from X-ray exposure. Some devices are processed for radiation tolerance that provides some degree of protection and increases the lifetimes of the devices for operations under X-ray exposure. This process is very expensive, and can not render the devices completely immune to radiation damage. Accordingly, in an open unprotected X-ray system, such as the Direct Coupled Detector System, all of the semiconductors in the system are susceptible to radiation damage.

Another disadvantage of the Direct Coupled Detector System arises from the noise properties of the PDA. Sensor noise increases with an increasing number of radiation exposures due to the build-up of undesirable charges in the oxide and silicon interface. Therefore, as the system is used, the noise level increases to an intolerable level, and eventually the image sensor (PDA) must be replaced. Since noise build-up is a function of radiation exposure, depending on the specified signal-to-noise ratio in a given system, the noise build-up may be the limiting factor as opposed to overall functional degradation, i.e., the noise build-up may limit the detector system life time more than the overall device functionality.

A second prior art system, the Fiber Optics Coupled Detector System, employs a fiber optics bundle to transmit the light from the scintillating layer to the image sensor array (IS). The object of this system is to isolate the image sensor array (IS) and its electronic components from the exposing X-ray beam. FIGS. 3a-b summarize the optical-mechanical configuration of a Fiber Optics Coupled Detector System. The components of the system are an X-ray source (XS), an exposing X-ray beam (XPXB), a lead shield (LS) with the slit to form an aperture (AP), a test specimen (TS) undergoing X-ray examination, a scintillating layer (SCIN) that is coated onto the surface of an optical flat transparent transmission plate (OTP), an image sensor (IS) in a DIP package, a fiber optic bond (FB), a fiber optic bundle (OF). The X-ray-to-light converter assembly (ASY) represents the assembly of the scintillating layer, the optical transmission plate, and the fiber optic bond.

The X-ray source passes through the aperture, the slit in the lead shield, to limit the area of the X-ray beam exposure to the vicinity of the X-ray-to-light converter assembly. The X-ray beam passes through the test specimen and is modulated proportionally to the pattern and density of the test specimen. The X-ray-to-light converter assembly converts the modulated X-ray flux densities to proportional light intensities. The light intensities are coupled into the fiber optic bundle through the fiber bond. The fiber optic bundle couples the light flux down to and through a second fiber bond that couples the light flux onto the surface of the image sensor, where the light flux is integrated and processed. The fiber optic transmission line allows the detector system to have a remotely placed X-ray-to-light converter assembly, hence isolating the image sensor and its associated electronic circuits from the path of the exposing X-ray beam. Remotely locating the X-ray detector assembly from the electronic assembly separates the optical path from the X-ray path and achieves the objective of protecting the electronic circuit components from radiation damage.

A second advantage of the Fiber Optics Coupled Detector System is the preservation of the resolution. A fiber optic bundle has a relatively high optical resolution. However, the fiber optic bundle does create a disadvantage for the system in that glass fiber bundles are expensive and difficult to fabricate.

A second disadvantage of the fiber optics system is the difficulty of assembly. The glass bundles are difficult to mount and bond. They must be critically aligned and bonded to their transmitting and receiving components to avoid undue optical transmission losses. The alignment constraint is even greater in the case of bonding the fiber optic ends to the surface of the elements of an image sensor because the fiber ends must be cut to exactly match the surface of the image array elements.

A third disadvantage of the Fiber Optics Coupled Detector System is the constraints imposed on the design of the enclosure. The complicated methods used in bonding and mounting the fiber optic require supporting structures within the enclosure. The supporting structure, which needs to be flexible enough to make initial adjustments, must also serve as a rigid mount to ensure that the bonded ends remain stationary in transportation and operation.

A third prior art system, the Two-Chip Detector System, employs two separate silicon chips and one common printed circuit board (PCB) to allow the shielding of the signal processing circuits. Because the p-n (or n-p) junction photodiode array (PDA) is much more tolerant to X-ray radiation damage than the signal processing circuits, only the signal processing circuits, and not the photodiode array (PDA), must be shielded. The two portions of the detector system can be integrated into two separate silicon chips, which then can be connected together with a common printed circuit board (PCB) using bonding wires. This arrangement allows a larger separation (greater than 5 mm) between the two circuits, thus making the shielding of the signal processing circuits much easier to align and implement.

FIG. 4a shows the separation of the detector system into two separate chips. The first chip is an array of n-p junction photodiodes (PDA). The anodes of each n-p junction photodiode in this PDA chip are tied together through the chip substrate. A reference bias (VREF) is applied to the common anode in operation. The cathode of each individual photodiode is connected to a bonding pad. The remaining signal processing circuits, which include pixel signal processing and sample/hold circuits, global video signal processing circuits, and readout control circuits for the array, as shown in FIG. 1, are integrated in a separate chip (SPC). Each pixel signal processing and sample/hold circuit is also connected to a bonding pad.

FIG. 4b shows how the two chips are connected using a common printed circuit board (PCB) substrate. Both the PDA chip and the SPC chip are bonded to a common PCB with a separation of 5 mm or more. Each photodiode on the PDA chip is connected to its corresponding pixel signal processing and sample/hold circuit on the SPC chip using wire bond. The separation of the two chips allows the proper shielding of the SPC chip and leaves only the PDA chip exposed to the residual X-ray beam.

FIG. 4c shows a sectional view of the optical and mechanical components of a Two-Chip Detector System. An X-ray shield (LS) is put on top of the detector system with an aperture aligned with the photodiode array. X-ray beams (XPXB) pass through the aperture and test specimen (TS) and impinge on the PDA chip. A scintillating layer deposited or placed on top of the PDA converts the X-ray energy into visible light. The visible photon collected by the PDA array is processed by the signal processing circuits on the SPC chip, similar to the direct coupling system describe in FIG. 1. Since the SPC chip is covered by the X-ray shield (LS), it is not exposed to the X-ray beam, thus avoiding X-ray radiation damage.

Although the two-chip detector system can eliminate the radiation damage on the SPC chip (which is more susceptible to X-ray radiation damage), the system does have a big drawback. As shown in FIG. 4b, the detector system requires two bonding wires for each pixel. The bonding wire assembly process increases the assembly cost, reduces production yield, and lowers the detector system reliability. This is especially true for detector systems with high resolution, such as a system with 50 um pixel width. There are thousands (even tens of thousands) of photodiodes in the system and each photodiode requires two bonding wires, making the assembly cost prohibitively high and the system unreliable. As a matter of fact, the small pixel width (50 um) prohibits the implementation of bonding pads and wire bonding in the present assembly technology.

Another disadvantage of the two-chip detector system arises from the parasitic capacitances and inductances associated with the bonding wire connections. The bonding pads on the two chips, the bonding wires, and the PCB wire traces each contribute parasitic, i.e. unwanted, capacitances and inductances. These parasitic capacitances and inductances pick up noise from the surrounding environment, increase the effects of amplifier noise on the SPC chip, and reduce the speed of the signal processing. Thus the parasitic elements compromise the overall noise and speed performance of the two-chip detector system.

Accordingly, it is an object of the present invention to provide an X-ray detector system that has a long life, is compact, requires low cost to manufacture, and that has a simple mechanical structure that lends itself to simple production assembly with minimal requirements for alignment, adjustment, and calibration testing.

Another object of the present invention is to reduce X-ray exposure on components which are sensitive to radiation damage by shielding the components in the detector system from X-ray exposure.

Yet another object of the present invention is to reduce noise and to improve speed performance in the X-ray detector system by reducing capacitive and inductive parasitic elements.

SUMMARY OF THE INVENTION

It is well known that X-rays cannot be focused, and can only be controlled with a shield (typically formed from lead) with aperture stops. This is why X-ray processes require one-to-one imaging, and why the scintillating layer needs to be in direct contact with the image sensor in the prior art systems described above. There are two key features of the present invention. One unique feature of the present invention is the utilization of buttable monolithic detector arrays to achieve a long X-ray detector system without the requirement of a wire bonding assembly process for each detector element.

A second unique feature of the present invention is the utilization of the precision chip-on-board (COB) assembly technology to accurately register the position of the photodiode array with respect to the substrate and thus allow accurate shielding of the signal processing circuits on the monolithic detector chip.

The present invention is a radiation damage resistant linear X-ray detector array system. The detector array system is based on the principle that the X-ray beam is collimated, and that one portion of a monolithic detector chip can be exposed to an X-ray beam while another portion of the monolithic chip can be shielded from the X-ray beam, if the two portions are properly separated on the chip.

The system of the present invention includes multiple chips of a monolithic detector array, a common substrate (such as a PCB, flexible tape, or the like), and typically a layer of scintillating material and a metal shield. The detector arrays are mounted end-to-end on the common substrate to form a longer than standard array using precision chip-on-board technology. On the monolithic detector chip, there is an array of n-p (or p-n) junction photodiode detectors (PDA). On the same monolithic detector chip, there are also pixel signal processing circuits, global video signal processing circuits, and timing generators which generate all the control clocks for the operation of the detector chip. Collectively these signal processing circuits and clock generator circuits are referred to as Peripheral Circuits (PC). There is a proper distance (separation or gap) from the PDA to the Peripheral Circuits on the monolithic chip. The width of the gap is around a minimum of 2 mm in the preferred embodiment. It is envisioned that the gap width may be reduced to around 1 mm or less as the technology progresses. The PDA is connected to the Peripheral Circuits using long metal lines (the gap width distance is relatively long in integrated circuit technology). A layer of scintillating material is typically placed on top of the PDA to convert the impinging X-ray beam into visible light which can be detected efficiently by the PDA. Some of the viable options for the scintillating material are $Gd_2O_2S$:Tb (GOS), CsI(Tl), and $CdWO_4$.

The photon energy of the visible light is collected by the PDA and converted into electrical video signals by the Peripheral Circuits. A metal shield is fastened to the substrate via through holes on the substrate using bolts and nuts. The metal shield covers the Peripheral Circuits to protect the circuits from X-ray radiation damage. The present invention also can apply to a shorter array where only one monolithic detector array is used on the substrate.

An advantage of utilizing the monolithic detector array in the present invention is the elimination of the necessity of a wire bonding assembly process for each individual photodiode element. The elimination of wire bonding greatly reduces the assembly cost, improves the production yield, and enhances the reliability of the detector system. The elimination of the bonding wires also eliminates parasitic capacitances and inductances, thereby providing the further advantages of lower noise and improved speed performances.

Another advantage of using monolithic detector array is to allow the implementation of an X-ray detector with small pixel widths.

Another advantage of using a buttable monolithic array to achieve a longer array is that each monolithic chip is smaller in chip area so that a much higher wafer yield can be achieved.

Still another advantage of using multiple monolithic chips and a common substrate to manufacture a longer detector is that long detector systems, such as arrays in tens of inches long, can be produced at low cost and high volume, making X-ray inspection systems much more affordable.

Utilization of a common substrate and a precision chip-on-board assembly process allows the accurate shielding of the radiation damage sensitive circuits without the requirements of lengthy adjustment, calibration, and testing.

Still another advantage of the present invention is that it provides low-cost and simple methods of shielding the radiation sensitive components of the system from X-ray radiation damage.

Another advantage of the present invention is that it enables the manufacture of a small, portable X-ray Detector Machine.

Yet another advantage of the present invention is that with its compact size and simplified method of radiation shielding, it is possible to design dual- or multi-X-ray scanning machines enclosed in the same space currently used to enclose a single X-ray scanning machine. The dual- or multi-X-ray scanning machines can be used for scanning a target simultaneously in different X-ray energy ranges for better detection.

Still another advantage arising from the small size and shielding properties of the present invention is that it is possible to implement a three-dimensional X-ray scanner, in which two scanning detectors system are positioned orthogonally with respect to each other.

These and other objects and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 2A is an isometric view of the system, and FIG. 2B is a sectional view.

FIG. 3A is an isometric view of the system, and FIG. 3B is a sectional view.

FIG. 4A shows the division of the detector system into two separate silicon chips. FIG. 4B shows the two chips connected together with a common PCB substrate using wire bonding. FIG. 4C is a sectional view of the Two-Chip System.

FIG. 5 shows the device layout of the buttable monolithic sensor array of the present invention.

FIGS. 7A-B show an X-ray detector system using buttable monolithic detector chips. FIG. 7A shows the cross section view of the system. FIG. 7B shows the top view of the X-ray detector system.

DETAILED DESCRIPTION OF THE PRESENT INVENTION

Figure 1:
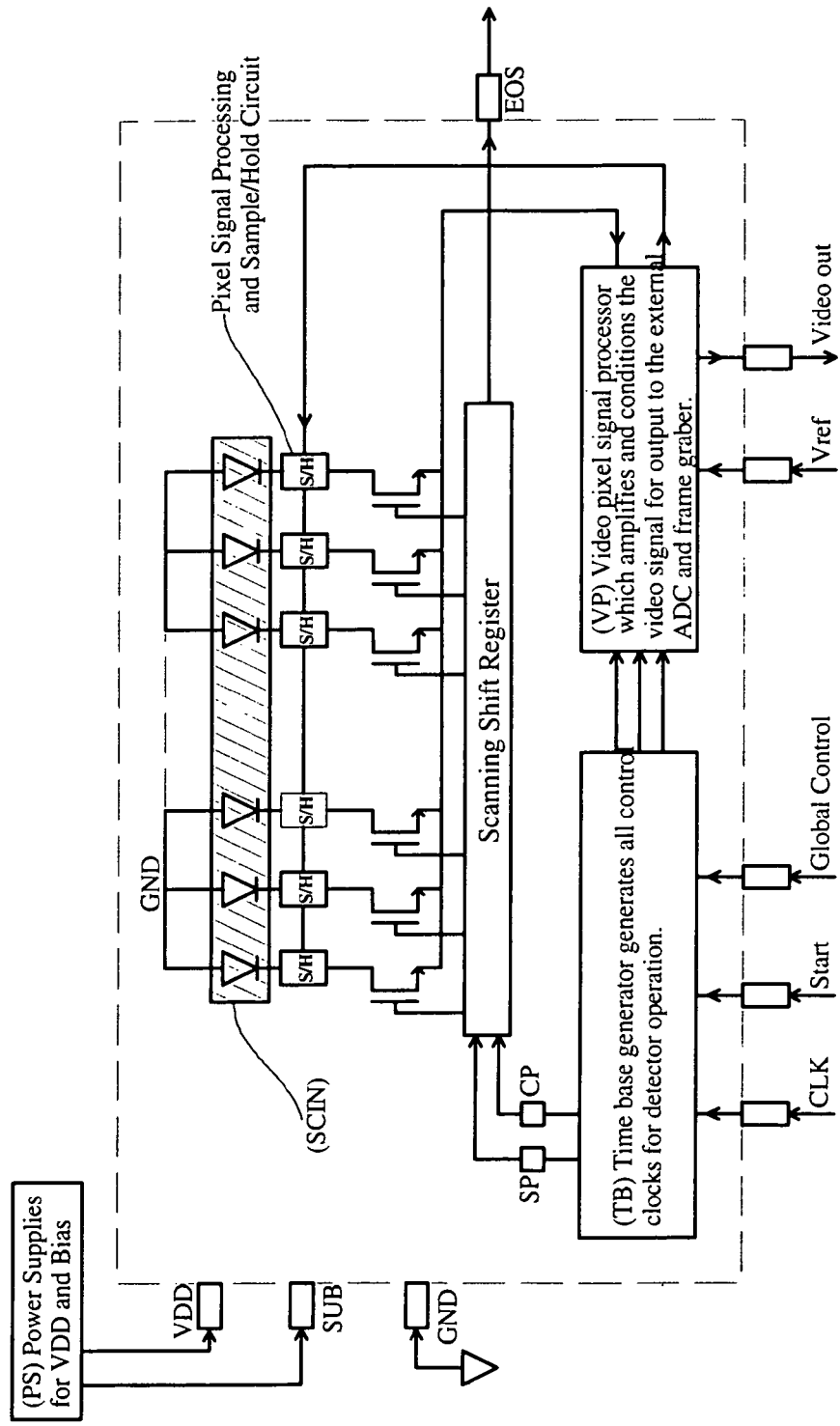
FIG. 1 illustrates a simplified electrical block diagram of a prior art image sensor array used in a Direct Coupled Detector System.
Figure 2B:
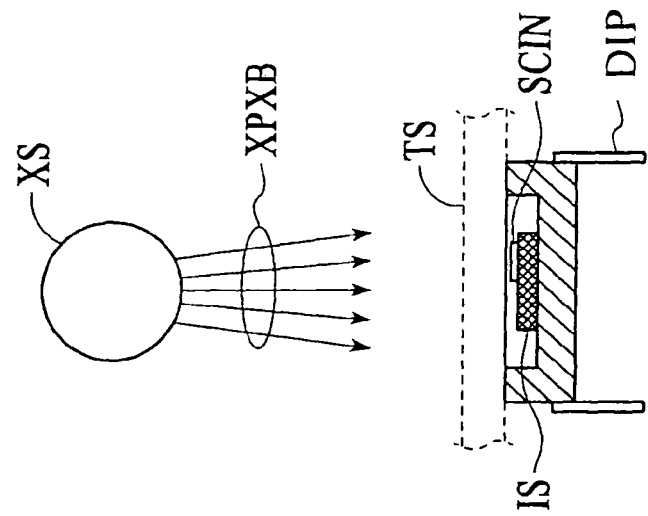
FIGS. 2A-B show the optical-mechanical configuration of a prior art Direct Coupled Detector System.
Figure 2A:
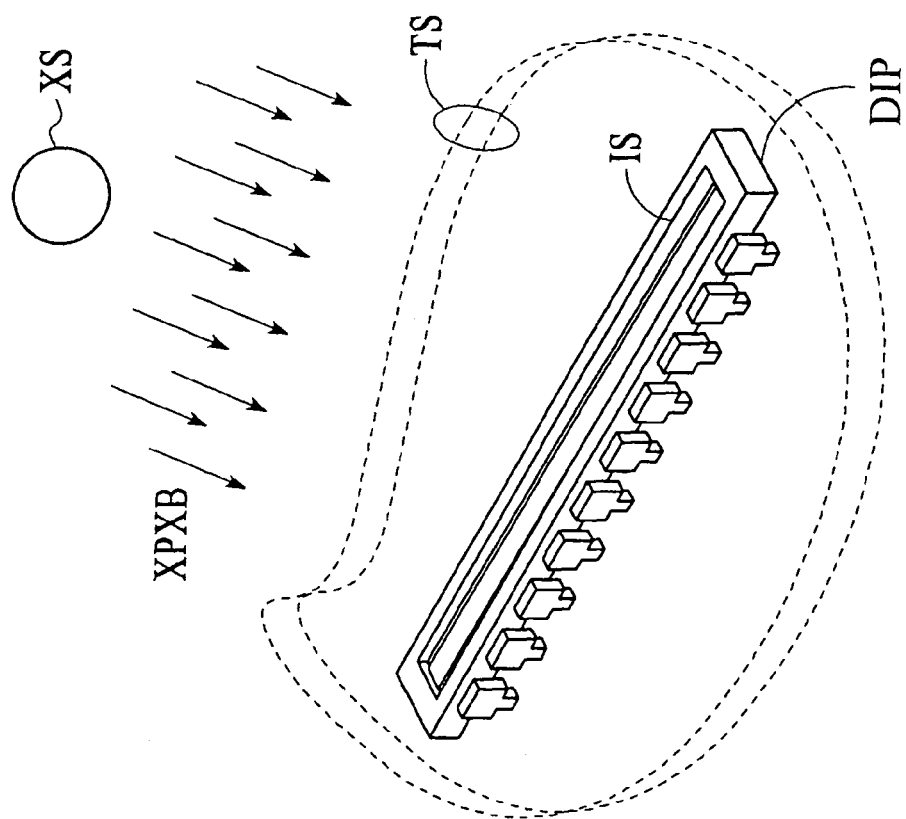
Figure 3B:
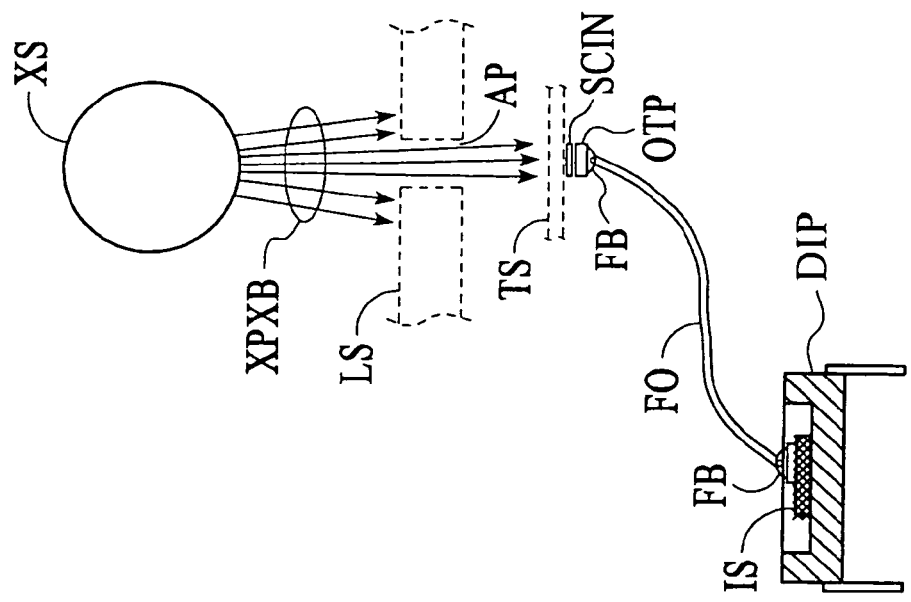
FIGS. 3A-B illustrate the optical-mechanical configuration of a second prior art system, a Fiber Optics Coupled Detector System.
Figure 3A:
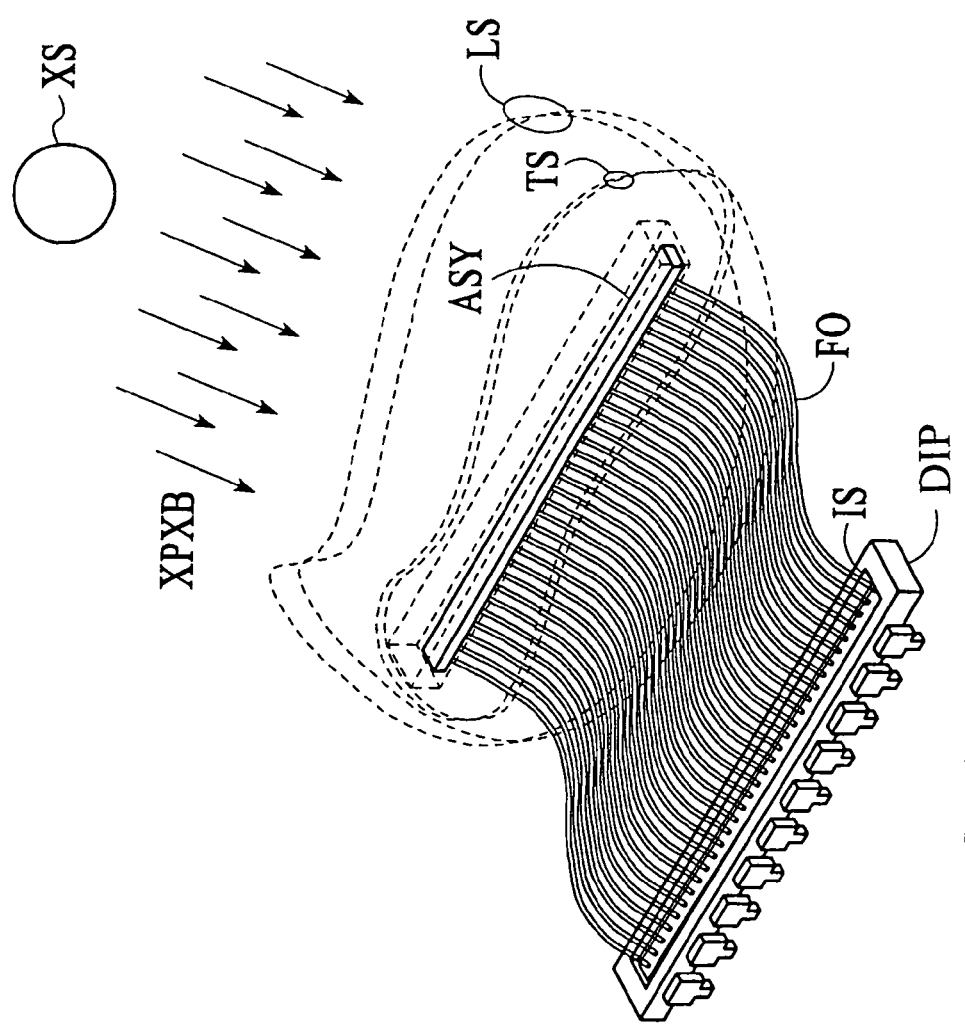
Figure 4A:
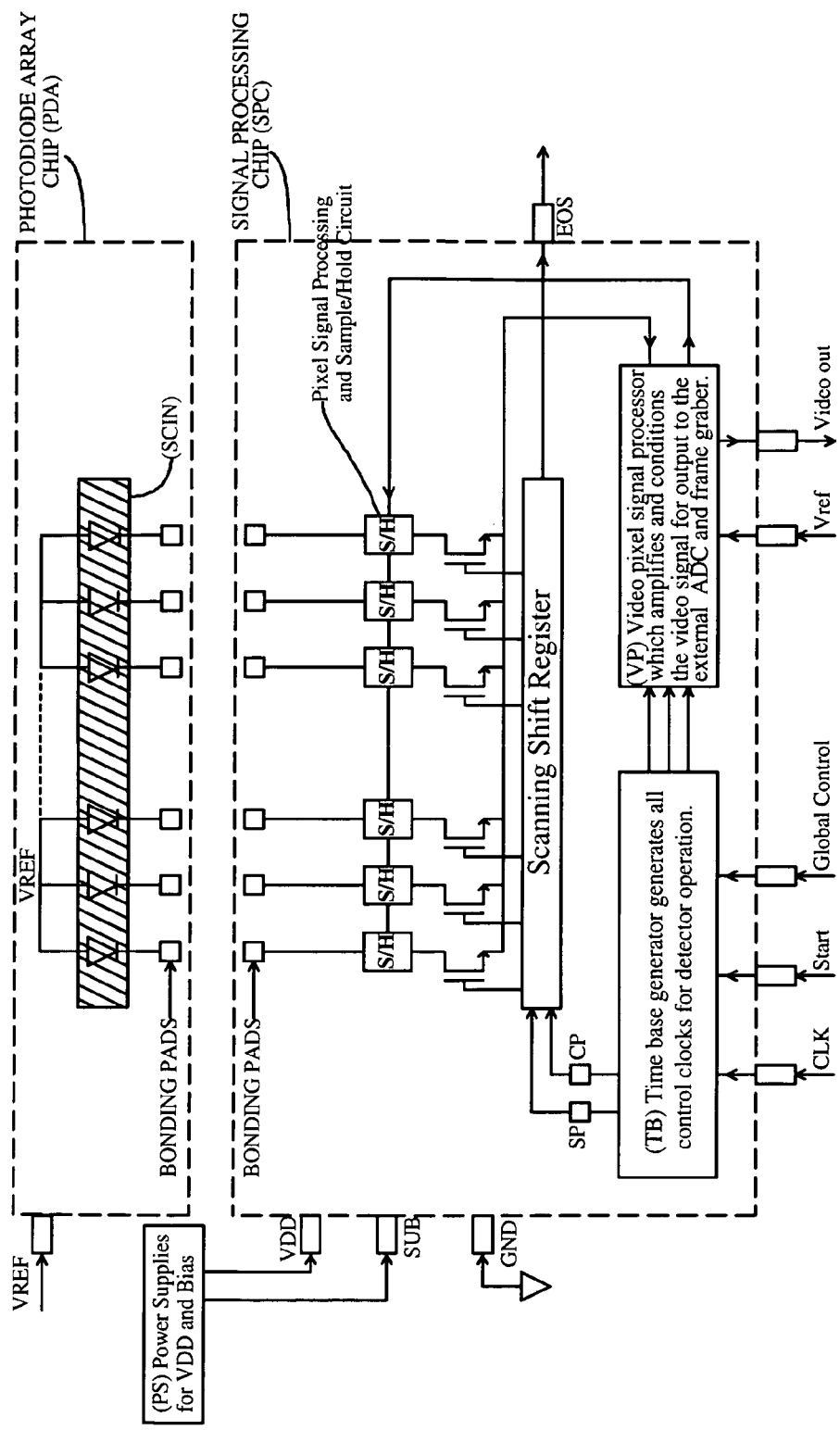
FIGS. 4A-C illustrate the optical-mechanical configuration of a third prior art system, a Two-Chip Detector System.
Figure 4B:
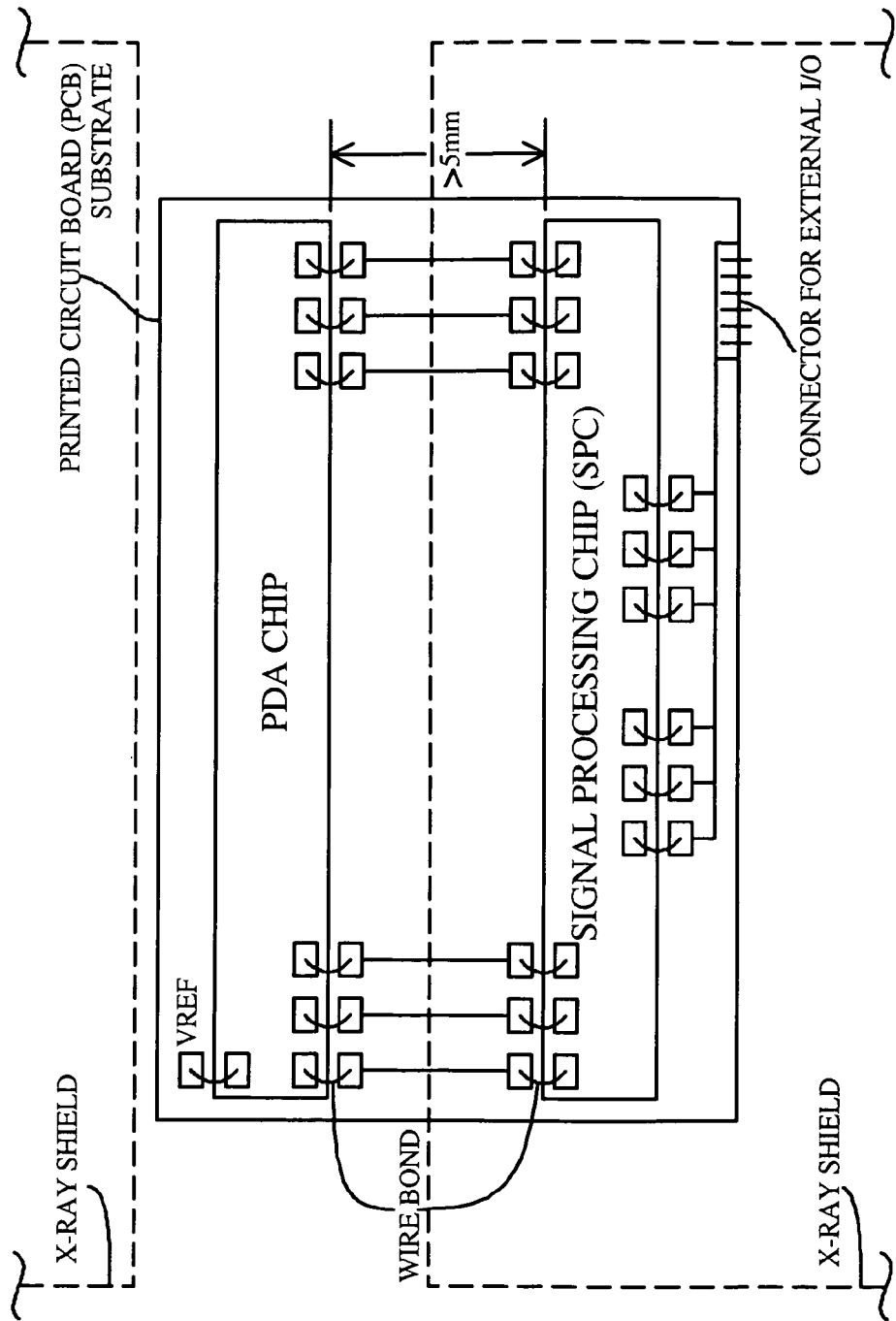
Figure 4C:
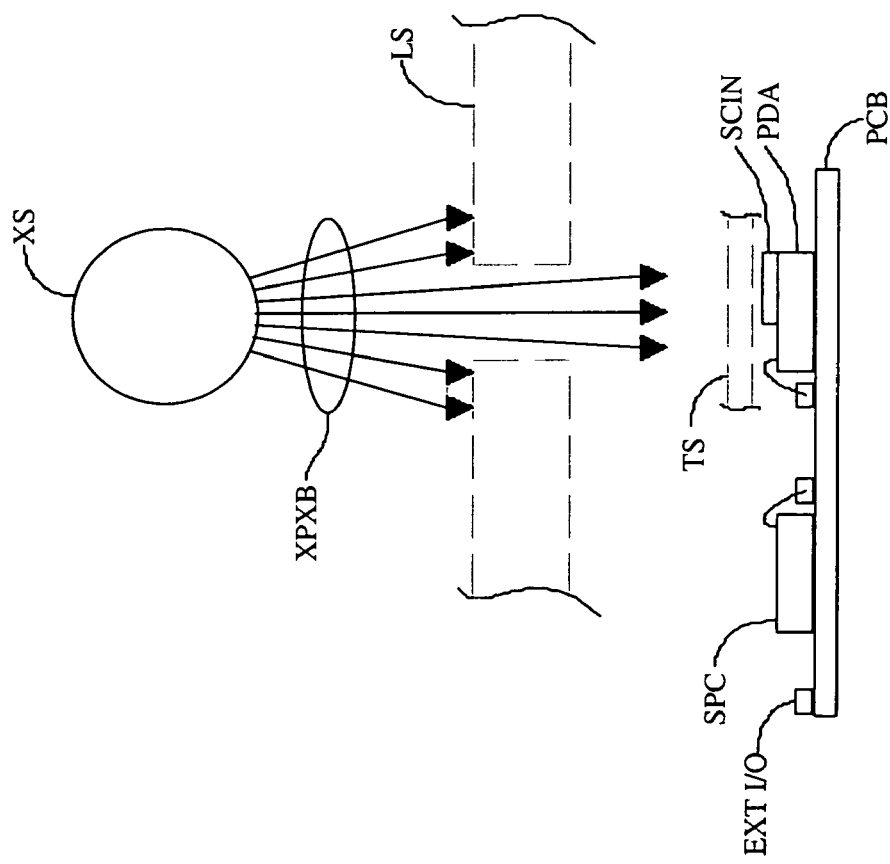

The present invention is a linear X-ray detector system 1 as illustrated in FIGS. 5, 6, and 7A-B. FIG. 7A is a sectional schematic view of the detector system 1. FIG. 7B shows a top view of the detector 1. An X-ray source 32 emits an X-ray beam 33. The X-ray beam 33 passes through a metal aperture 34, resulting in a collimated X-ray beam 35 downstream of the aperture 34. A test specimen 36 is positioned underneath the collimated X-ray beam 35. The test specimen 36 modulates the X-ray beam 35 according to the pattern and material density of the test specimen 36. The modulated X-ray pattern is then detected and an image produced by the detector unit placed under the test specimen 36.

The detector unit comprises a long detector array 3 bonded on a PCB substrate 2. (The detector array 3, formed by butting multiple chips of monolithic detector array 31 end-to-end, is described in further detail below with reference to FIG. 6.) A scintillating layer 4 is placed or deposited on top of the photodiode array of the detector unit. Some of the viable options for the scintillating material layer 4 are $Gd_2O_2S$:Tb (GOS), CsI(Tl), and $CdWO_4$.

A heavy radiation protection metal shield 5, typically a lead shield, is placed in a holder 6 and is fastened to the PCB substrate 2 using nuts and bolts inserted through fastening holes 8. A spacer 7 is used underneath the metal shield holder 6 to prevent the holder 6 from damaging the sensor array 3. The connector 9 on the PCB 2 connects the detector system 1 to outside systems.

A critical component of the detector system 1 is a unique buttable monolithic detector array 31 as shown in FIG. 5. The detector array 31 is a monolithic silicon based image sensor array. The integrated circuit of detector array 31 comprises both an array of n-p (or p-n) junction photodiodes 41, and also video signal processing circuits 42. The video signal processing circuits 42 contain pixel signal processing and sample/hold circuits, global video signal processing circuits, and the readout control circuits for the array. To facilitate buttability, the photodiode array 41 is extended to the edge of the chip at both ends.

Although the photodiode array 41 and the video signal processing circuits 42 are situated on the same substrate 2, the two sets of circuits are separated by a gap or separation 43.

The gap 43 is an area approximately a minimum of 2 mm in the preferred embodiment. It is envisioned that the width of the gap 43 may be reduced to around 1 mm or less as the technology progresses. The gap 43 is void of any active circuitry. The photodiode array 41 and the video signal processing circuits 42 are connected across the gap 43 using metal lines 44.

The gap 43 allows the alignment of the heavy radiation protection metal shield 5 on top of the video signal processing circuits 42 without preventing optical light from reaching photodiode array 41. The video signal processing circuits 42 are thereby shielded so as to avoid the impingement of the residual X-ray photons on the circuits. The shielding thus eliminates X-ray radiation damage to the detector array 31. To assure that the sensitive video signal processing circuits 42 are fully shielded and protected, the circuit layout is designed so that the video signal processing circuits are 1 mm or more away from the chip edges as shown in FIG. 5. Metal bonding pads 45 are provided for connection of the detector system 1 to outside components.

Figure 6:
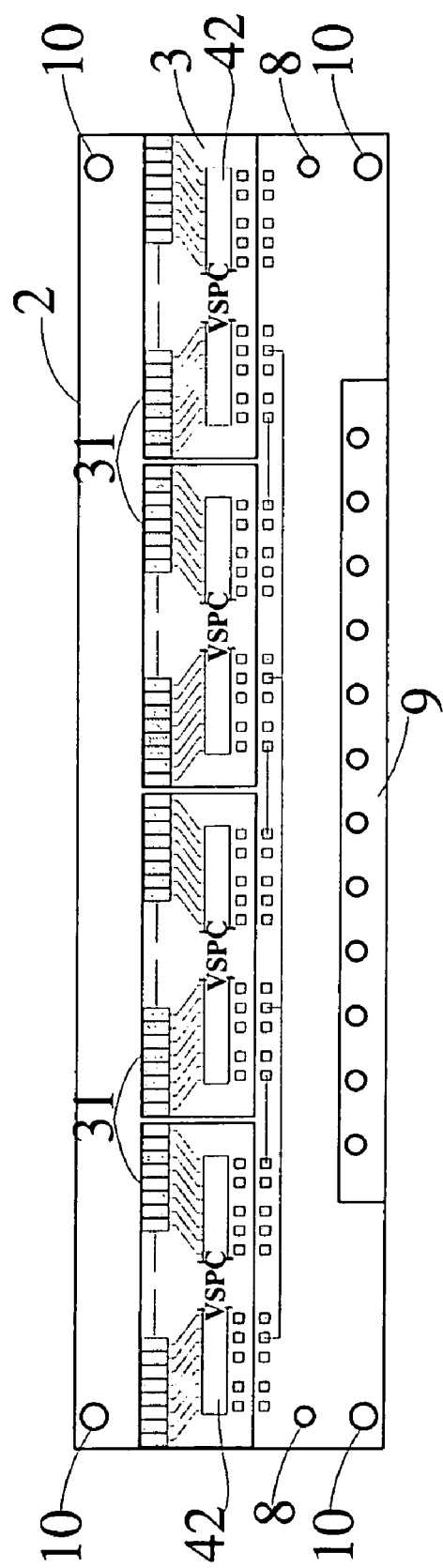
FIG. 6 shows the construction of a longer sensor array using multiple buttable sensor chips using a PCB substrate and precision chip-on-board (COB) assembly technology.

FIG. 6 illustrates the construction of a long detector array 3 using multiple detector arrays 31 and precision chip-on-board (COB) assembly technology. In FIG. 6, there are four detector arrays 31 butted end-to-end on a common substrate 2 to form the long detector array 3. In practice, any number of detector arrays 31 can be butted end-to-end to form different lengths of detector array 3 as desired by the user.

There are two through holes 8 on the substrate 2 positioned to receive the metal shield 5 (shown in FIG. 7A). With COB technology, the required chips can be placed accurately on the substrate 2 with respect to the metal shield fastening holes 8. As a result of the precise registration of the chips, the metal shield 5 can be easily installed without the need for any precision adjustment. The metal shield 5 provides critical protection for the sensitive video signal processing circuits 42. There are also precision holes 10 on the substrate to allow accurate installation of the detector arrays 31 in the X-ray detector system 1.

The outermost edges of the detector arrays 31 are aligned with the edges of the substrate 2 at both ends. This arrangement makes possible the butting of multiple PCBs into very long X-ray detector systems, the systems being tens of inches long, and adapted for tire inspection, lumber inspection, and security inspection applications.

During operation of the detector system 1, the exposing collimated X-ray beam 35 passes through the test specimen 36 and excites the scintillating material layer 4 proportionally to the X-ray density patterns of the test specimen 36. The converted optical image on the scintillating material layer 4 surface is absorbed by the photodiode array underneath. The pixel and global signal processing circuits of the sensor chips then convert the optical image of the scintillating layer 4 into electrical signals for further processing.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. A linear X-ray detector system comprising:
an X-ray source that produces an X-ray beam,
a substrate with a detector unit mounted thereon; wherein
the detector unit detects a modulated X-ray beam following exposure of a test specimen to the X-ray beam, the detector unit thereafter producing an image of the test specimen; and wherein
the detector unit comprises at least one buttable monolithic detector array chip, each detector array chip comprising both a PDA comprising an array of n-p or p-n junction photodiode detectors and also peripheral circuits comprising pixel signal processing circuits, global video signal processing circuits, and timing generators which generate all control clocks necessary for operation of the detector array chip, the PDA and the peripheral circuits being in electrical communication without the use of a wire bonding assembly process.

2. The linear X-ray detector system of claim 1 wherein:
the PDA is separated from the peripheral circuits on the detector array chip by a distance sufficient to allow the modulated X-ray beam to impinge on the PDA, but not on the peripheral circuits.

3. The linear X-ray detector system of claim 2 wherein:
the peripheral circuits are protected from impingement of the modulated X-ray beam by a metal shield.

4. The linear X-ray detector system of claim 2 wherein:
the PDA is precisely positioned on the substrate by chip-on-board assembly technology to accurately register a position of the photodiode array with respect to the substrate, thereby enabling simple and accurate shielding of the peripheral circuits on the monolithic detector array chip.

5. The linear X-ray detector system of claim 1 wherein:
the PDA is separated from the peripheral circuits on the detector array chip by a minimum distance of approximately 1 mm, the PDA being connected to the peripheral circuits using metal lines.

6. The linear X-ray detector system of claim 5 wherein:
the peripheral circuits are protected from impingement of the modulated X-ray beam by a metal shield.

7. A linear X-ray detector system comprising:
an X-ray source that produces an X-ray beam,
a substrate with a detector unit mounted thereon; wherein
the detector unit detects a modulated X-ray beam following exposure of a test specimen to the X-ray beam, the detector unit thereafter producing an image of the test specimen; and wherein
each the detector array chip comprises both a PDA comprising an array of n-p or p-n junction photodiode detectors and also peripheral circuits comprising pixel signal processing circuits, global video signal processing circuits, and timing generators which generate all control clocks necessary for operation of the detector array chip, the PDA being separated from the peripheral circuits on the detector array chip by a distance sufficient to allow the modulated X-ray beam to impinge on the PDA, but not on said the peripheral circuits, and said the PDA and said the peripheral circuits being in electrical communication without the use of a wire bonding process.

8. The linear X-ray detector system of claim 7 wherein:
the peripheral circuits are protected from impingement of the modulated X-ray beam by a metal shield.

9. The linear X-ray detector system of claim 7 wherein:
the PDA is separated from the peripheral circuits on the detector array chip by a minimum distance of approximately 1 mm, the PDA being connected to the peripheral circuits using metal lines.

10. The linear X-ray detector system of claim 9 wherein:
the peripheral circuits are protected from impingement of the modulated X-ray beam by a metal shield.

11. The linear X-ray detector system of claim 7 wherein:
the PDA is precisely positioned on the substrate by chip-on-board assembly technology to accurately register a position of the photodiode array with respect to the substrate, thereby enabling simple and accurate shielding of the peripheral circuits on the monolithic detector array chip.

12. A buttable monolithic detector array chip comprising:
a PDA comprising an array of n-p or p-n junction photodiode detectors,
peripheral circuits comprising pixel signal processing circuits, global video signal processing circuits, and timing generators which generate all control clocks necessary for operation of the detector array chip; wherein
the PDA and the peripheral circuits share a single substrate, the PDA being separated from the peripheral circuits on the detector array chip by a distance sufficient to allow an X-ray beam to impinge on the PDA, but not on the peripheral circuits, and the PDA and the peripheral circuits being in electrical communication without the use of a wire bonding process.

13. The monolithic detector array chip of claim 12 wherein:
the PDA is separated from the peripheral circuits on the detector array chip by a minimum distance of approximately 1 mm, the PDA being connected to the peripheral circuits using metal lines.

14. The monolithic detector array chip of claim 13 wherein:
the substrate comprises a mounting means adapted to receive a heavy metal shield to protect the peripheral circuits.

15. The monolithic detector array chip of claim 12 wherein:
the substrate comprises a mounting means adapted to receive a heavy metal shield to protect the peripheral circuits.

* * * * *